(12) United States Patent
Cheng et al.

(10) Patent No.: US 11,069,800 B2
(45) Date of Patent: Jul. 20, 2021

(54) SINGLE ELECTRON TRANSISTOR WITH GAP TUNNEL BARRIERS

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/271,069

(22) Filed: Feb. 8, 2019

(65) Prior Publication Data

US 2019/0189790 A1 Jun. 20, 2019

Related U.S. Application Data

(62) Division of application No. 15/464,768, filed on Mar. 21, 2017, now Pat. No. 10,381,468.

(51) Int. Cl.
*H01L 29/76* (2006.01)
*H01L 29/66* (2006.01)
*H01L 29/423* (2006.01)
*H01L 29/786* (2006.01)

(52) U.S. Cl.
CPC .... *H01L 29/7613* (2013.01); *H01L 29/42392* (2013.01); *H01L 29/66439* (2013.01); *H01L 29/78618* (2013.01); *H01L 29/78642* (2013.01); *H01L 29/78696* (2013.01)

(58) Field of Classification Search
CPC ......... H01L 29/66439; H01L 29/66469; H01L 29/7613; H01L 49/006; H01L 2924/13079; H01L 29/515; H01L 49/0006; H01L 27/2454; H01L 29/0649; H01L 29/0653;

(Continued)

(56) References Cited

U.S. PATENT DOCUMENTS

| 5,710,051 | A | * | 1/1998 | Park ................ B82Y 10/00 438/149 |
| 6,335,245 | B2 | | 1/2002 | Park et al. |
| 6,573,526 | B1 | | 6/2003 | Yamashita et al. |

(Continued)

FOREIGN PATENT DOCUMENTS

| CN | 1383213 A | 12/2002 |
| CN | 1176499 C | 11/2004 |

(Continued)

OTHER PUBLICATIONS

English translation for Korean Application No. KR100966264B1.

(Continued)

*Primary Examiner* — Monica D Harrison
*Assistant Examiner* — John Lin
(74) *Attorney, Agent, or Firm* — Kurt Goudy; Ryan, Mason & Lewis, LLP

(57) ABSTRACT

A semiconductor device includes a single electron transistor (SET) having an island region, a bottom source/drain region under the island region, and a top source/drain region over the island region, a first gap between the bottom source/drain region and the island region, a second gap between the top source/drain region and the island region, and a gate structure on a side of the island region.

15 Claims, 6 Drawing Sheets

(58) Field of Classification Search
CPC ......... H01L 29/78642; H01L 29/78618; H01L 29/78696; H01L 29/42392; Y01S 977/937
See application file for complete search history.

(56) References Cited

U.S. PATENT DOCUMENTS

| | | | |
|---|---|---|---|
| 6,894,352 B2 | 5/2005 | Hu et al. | |
| 6,998,310 B2 | 2/2006 | Fraboulet et al. | |
| 7,547,932 B2 | 6/2009 | Zhang et al. | |
| 8,927,362 B2 | 1/2015 | Ching et al. | |
| 8,932,936 B2 | 1/2015 | Liu et al. | |
| 2004/0108529 A1* | 6/2004 | Kang | H01L 29/66439 257/288 |
| 2015/0108430 A1 | 4/2015 | Cheng et al. | |
| 2015/0303258 A1 | 10/2015 | Kuhn et al. | |
| 2015/0340438 A1* | 11/2015 | Zhu | H01L 29/78648 257/77 |
| 2015/0340457 A1 | 11/2015 | Xie et al. | |
| 2016/0148770 A1 | 5/2016 | Duerig et al. | |
| 2016/0240652 A1 | 8/2016 | Ching et al. | |
| 2017/0250261 A1* | 8/2017 | Kim | H01L 29/66742 |

FOREIGN PATENT DOCUMENTS

| | | |
|---|---|---|
| KR | 1020090079348 A | 7/2009 |
| KR | 100966264 B1 | 6/2010 |

OTHER PUBLICATIONS

English translation for Korean Application No. KR1020090079348A.
English translation for China Application No. CN1176499C.
English translation for China Application No. CN1383213A.
A. Kumar et al., "Single Electron Transistor: Applications and Limitations," Advance in Electronic and Electronic Engineering, 2013, pp. 57-62, vol. 3, No. 1.
List of IBM Patents or Patent Applications Treated as Related.

* cited by examiner

SINGLE ELECTRON TRANSISTOR WITH GAP TUNNEL BARRIERS

TECHNICAL FIELD

The field generally relates to semiconductor devices and methods of manufacturing same and, in particular, to forming a vertical single electron transistor (SET) with gaps of air, other gases or a vacuum as tunnel barriers.

BACKGROUND

A single electron transistor (SET) uses controlled electron tunneling to amplify current, and includes a conductive island connected through two tunneling junctions to drain and source regions. The island is further connected to a gate electrode through a capacitor. Each tunnel junction includes a thin insulator (also referred to herein as a "tunnel barrier") located between a source/drain region and the conductive island. When there is sufficient bias between source and drain regions, electrons can actively tunnel to and from the island through the tunneling junctions. The electric charge that flows through the tunneling junctions flows in multiples of the charge of a single electron (e).

SETs are being researched as a potential device option beyond the conventional complementary metal oxide semiconductor (CMOS) transistors. An SET can be useful when applied in, for example, a highly sensitive electrometer, single-electron spectroscopy, a charge sensor, an infrared radiation detector, a thermometer, a memory and microwave detection. SET characteristics depend on the tunnel barrier and uniformity of SET island size.

SUMMARY

According to an exemplary embodiment of the present invention, a method for manufacturing a semiconductor device includes forming a stacked configuration of semiconductor layers on a substrate having a first semiconductor layer on the substrate, wherein the stacked configuration includes a first sacrificial semiconductor layer on the first semiconductor layer, a second semiconductor layer on the first sacrificial semiconductor layer, a second sacrificial semiconductor layer on the second semiconductor layer, and a third semiconductor layer on the second sacrificial semiconductor layer. The method further includes performing a first patterning of the stacked configuration and the first semiconductor layer by removing first portions of the stacked configuration and the first semiconductor layer, forming gate structures in place of the removed first portions of the stacked configuration and the first semiconductor layer, performing a second patterning of the stacked configuration and the first semiconductor layer by removing second portions of the stacked configuration and the first semiconductor layer, selectively removing from the stacked configuration the first and second sacrificial semiconductor layers exposed by the second patterning to create a first gap and a second gap respectively in place of the selectively removed first and second sacrificial semiconductor layers, and forming a dielectric layer in place of the removed second portions of the stacked configuration and the first semiconductor layer.

According to an exemplary embodiment of the present invention, a semiconductor device includes a single electron transistor (SET) having an island region, a bottom source/drain region under the island region, and a top source/drain region over the island region, a first gap between the bottom source/drain region and the island region, a second gap between the top source/drain region and the island region, and a gate structure on a side of the island region.

According to an exemplary embodiment of the present invention, a method for manufacturing a semiconductor device includes forming a stacked configuration of semiconductor layers on a substrate having a first semiconductor layer on the substrate, wherein the stacked configuration includes a first sacrificial layer on the first semiconductor layer, a second semiconductor layer on the first sacrificial layer, a second sacrificial layer on the second semiconductor layer, and a third semiconductor layer on the second sacrificial layer, wherein the first and third semiconductor layers are doped. The method further includes performing a first patterning of the stacked configuration and the first semiconductor layer by removing first portions of the stacked configuration and the first semiconductor layer, forming gate structures in place of the removed first portions of the stacked configuration and the first semiconductor layer, performing a second patterning of the stacked configuration and the first semiconductor layer by removing second portions of the stacked configuration and the first semiconductor layer, selectively removing from the stacked configuration the first and second sacrificial layers exposed by the second patterning to create a first gap and a second gap respectively in place of the selectively removed first and second sacrificial layers, and forming a dielectric layer in place of the removed second portions of the stacked configuration and the first semiconductor layer.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 2:
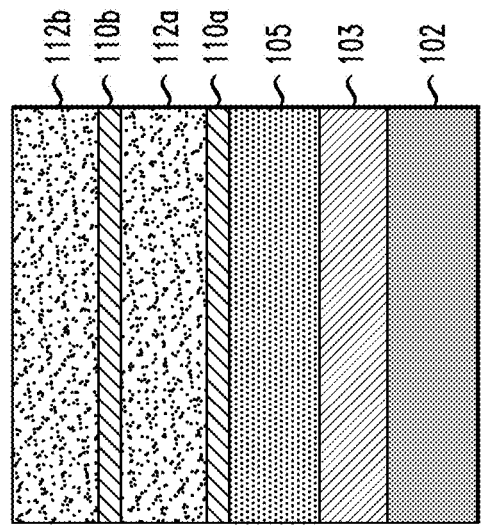
FIG. 2 is a cross-sectional view illustrating growth of silicon germanium (SiGe) and silicon (Si) layers in a method of manufacturing a semiconductor device, according to an exemplary embodiment of the present invention.

Exemplary embodiments of the invention will now be discussed in further detail with regard to semiconductor devices and methods of manufacturing same and, in particular, to formation of a vertical single electron transistor (SET) that includes gaps as tunnel barriers between island and source/drain regions. In accordance with embodiments of the present invention, the gaps can include, for example, air, another gas, such as hydrogen, nitrogen, oxygen, helium, argon, neon, or krypton. In another alternative, the gaps can be a vacuum.

It is to be understood that the various layers and/or regions shown in the accompanying drawings are not drawn to scale, and that one or more layers and/or regions of a type commonly used in, for example, a complementary metal-oxide semiconductor (CMOS), nanowire field-effect transistor (FET), fin field-effect transistor (FinFET), metal-oxide-semiconductor field-effect transistor (MOSFET), vertical FET, SET and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, nanowire FETs, nanosheet FETs, vertical FETs, SETs, CMOSs, MOSFETs and/or FinFETs. By way of non-limiting example, the semiconductor devices can include, but are not limited to nanowire FET, nanosheet FET, vertical FET, SET, CMOS, MOSFET and FinFET devices, and/or semiconductor devices that use CMOS, MOSFET, nanowire FET, nanosheet FET, vertical FET, SET and/or FinFET technology.

As used herein, "height" refers to a vertical size of an element (e.g., a layer, trench, hole, opening, etc.) in the cross-sectional views measured from a bottom surface to a top surface of the element, and/or measured with respect to surface on which the element is located. Conversely, a "depth" refers to a vertical size of an element (e.g., a layer, trench, hole, opening, etc.) in the three-dimensional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the three-dimensional and/or cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on" "overlying", "atop", "on top", "positioned on" "positioned atop" or the term "direct contact" mean that a first element and a second element are connected without any intervening elements, such as, for example, intermediary conducting, insulating or semiconductor layers, present between the first element and the second element.

Embodiments of the present invention provide a SET that includes smaller SET islands and lower island-to-source/drain capacitance when compared with conventional SETs. Embodiments of the present invention also provide SETs that can be fabricated using one or more CMOS processing techniques. A method and structure for forming an array of vertical single electron transistors (SETs) with uniform SET island sizes and tunnel barriers is provided. Although not necessarily limited thereto, the illustrated embodiments show a pair of SETs, where the SETs are formed by CMOS processing techniques, resulting in uniform structures. In accordance with an embodiment of the present invention, a SET island includes silicon (Si) and the island size is controlled by epitaxy and sidewall imaging transfer steps, so that the island can have length and width dimensions of, for example, 5 nm×5 nm or smaller. The gaps between source/drain regions and island function as tunnel barriers. For example, due to the relatively low dielectric constant (k) of air, the gaps reduce the island-to-source/drain capacitance with respect to conventional structures, and thus improve SET sensitivity.

Figure 1:
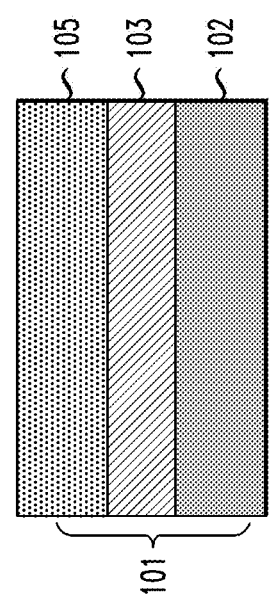
FIG. 1 is a cross-sectional view of a silicon on insulator (SOI) structure used in a method of manufacturing a semiconductor device, according to an exemplary embodiment of the present invention.

FIG. 1 is a cross-sectional view of a silicon-on-insulator (SOI) structure 101 used in a method of manufacturing a semiconductor device, according to an exemplary embodiment of the present invention. Referring to FIG. 1, a semiconductor substrate 102 includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate. In accordance with an embodiment of the present invention, a buried insulating layer 103, such as, for example, a buried oxide or nitride layer is located on an upper surface of the semiconductor substrate 102.

An n+ or p+ doped semiconductor layer 105 is formed on the buried insulating layer 103. The doped semiconductor layer 105 can include, but is not necessarily limited to, Si, Ge, SiGe or Si:C (carbon-doped silicon). In accordance with an embodiment, the layer 105 comprises silicon, and may be referred to herein as a silicon-on-insulator (SOI) layer, at least part of which will become a source region or drain region of resulting vertical SETS.

Doping can be performed using processes, such as, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), boron fluoride ($BF_2$), gallium (Ga), indium (In), and thallium (Tl) at various concentrations. For example, in a non-limiting example, a dopant concentration range may be 1e18/cm$^3$ to 1e21/cm$^3$.

FIG. 2 is a cross-sectional view illustrating growth of silicon germanium (SiGe) and silicon (Si) layers in a method of manufacturing a semiconductor device, according to an exemplary embodiment of the present invention. In accordance with an embodiment of the present invention, a repeating stacked structure including a Si layer stacked on a SiGe layer thinner than the Si layer, is epitaxially grown on the SOI layer 105. The thinner SiGe layers 110a and 110b (i.e., having less height) may be, for example, about 0.5 nm-about 3 nm and the thicker Si layer 112a (i.e., having greater height) may be, for example, about 3 nm to about 5 nm. Si layer 112b will become part of a top source/drain of a resulting SET. The thickness of layer 112b can be, for example, 10 nm or larger to accommodate device fabrication. Although they can have the same materials as each other, layers 112a and 112b do not have to have the same materials as each other, as long as layers 112a and 112b have different materials from layers 110a and 110b. Layer 112a can be doped, and layer 112b can be doped or undoped. In the case that both layers 112a and 112b are doped, they may have the same dopant species or different dopant species. Layers 112b and 105 (one as source and the other as drain) typically have the same dopant polarity, but do not necessarily need to have the same doping concentrations. Alternatively, layers 112b and 105 can have the same doping concentrations. While FIG. 2 illustrates two SiGe layers and two Si layers in the stacked configuration, the embodiments of the present invention are not necessarily limited thereto, and may include more than two combinations of the Si/SiGe layers.

In accordance with embodiments of the present invention, layers 110a and 110b (e.g., SiGe) are used as sacrificial layers and later removed selective to the layers 105, 112a and 112b to form the gaps. SiGe can be used for the sacrificial layers 110a and 110b, while the remaining layers 105, 112a and 112b are silicon. Alternatively, Si can be used for the sacrificial layers 110a and 110b, and the remaining layers 105, 112a and 112b can be SiGe or Ge. If III-V materials are used, the material choices are even more flexible. For example, InP can be used for the sacrificial layers 110a and 110b, and GaAs, InAs, or InGaAs for the remaining layers 105, 112a and 112b.

In accordance with an embodiment of the present invention, at least part of the uppermost Si layer becomes a drain or source region of resulting vertical SETS. The Si and SiGe layers can each be doped (e.g., by n+ and p+ type dopants mentioned herein). In accordance with an embodiment, the layers 110a, 110b and 112a, 112b are not necessarily limited to SiGe and Si, and may comprise, other materials as noted above.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and may be conducted at higher or lower temperatures as needed.

A number of different sources may be used for the epitaxial growth. For example, the sources may include precursor gas or gas mixture including for example, a silicon containing precursor gas (such as silane) and/or a germanium containing precursor gas (such as a germane). Carrier gases like hydrogen, nitrogen, helium and argon can be used.

Figure 3:
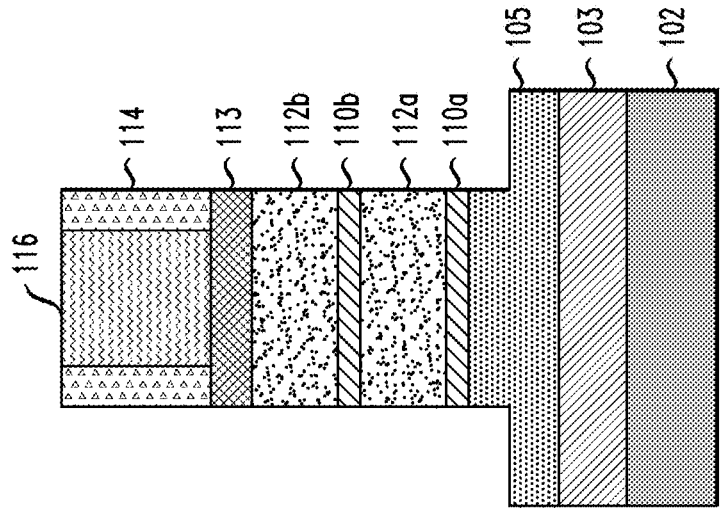
FIG. 3 is a cross-sectional view illustrating formation of a hardmask, a mandrel and spacers in a method of manufacturing a semiconductor device, according to an exemplary embodiment of the present invention.

FIG. 3 is a cross-sectional view illustrating formation of a hardmask, a mandrel and spacers in a method of manufacturing a semiconductor device, according to an exemplary embodiment of the present invention. A hardmask 113 including, for example, a dielectric material, such as silicon nitride (SiN) is formed on the uppermost Si layer 112b of the stacked configuration of Si and SiGe layers 110a, b and 112a, b. Patterning of the stacked configuration can be performed using a mandrel 116 and spacers 114 as a mask for patterning. The process includes using lithography or any other suitable patterning techniques to form the mandrel 116. The mandrel material can include, but is not limited to, amorphous silicon or amorphous carbon. After the mandrel formation, a conformal film can be deposited and then followed by a directional etch such as reactive ion etch (RIE). The conformal film will form spacers 114 at both sides of the mandrel 116. The spacer material can include, but is not limited, oxide or SiN.

Figure 4:
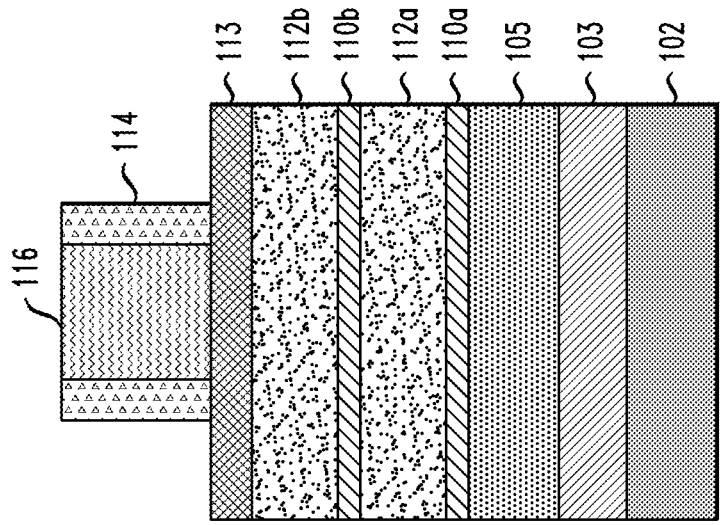
FIG. 4 is a cross-sectional view illustrating patterning the structure of FIG. 3, in a method of manufacturing a semiconductor device, according to an exemplary embodiment of the present invention.

FIG. 4 is a cross-sectional view illustrating patterning the structure of FIG. 3, in a method of manufacturing a semiconductor device, according to an exemplary embodiment of the present invention. Referring to FIG. 4, portions of the hardmask 113, the stacked configuration of Si and SiGe layers 110a, b and 112a, b, and the SOI layer 105 are removed using, for example an anisotropic etching process, such as reactive ion etching (RIE), where the mandrel 116 and spacers 114 are an etch mask covering portions that are not etched.

Figure 5:
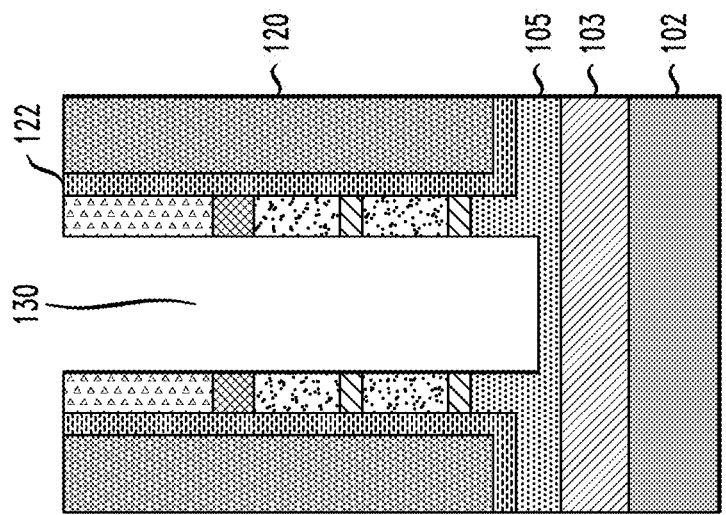
FIG. 5 is a cross-sectional view illustrating formation of gate structures, in a method of manufacturing a semiconductor device, according to an exemplary embodiment of the invention.

FIG. 5 is a cross-sectional view illustrating formation of gate structures, in a method of manufacturing a semiconductor device, according to an exemplary embodiment of the invention. Referring to FIG. 5, gate structures, including for example, gate conductors and gate dielectrics are formed in place of the removed portions of the hardmask 113, the stacked configuration of Si and SiGe layers 110a, b and 112a, b, and the SOT layer 105. The gate dielectric layers 122 are conformally formed on side portions of the spacers 114, hardmask 113, the stacked configuration of Si and SiGe layers 110a, b and 112a, b, and the SOI layer 105, as well as on an exposed upper surface of a remaining portion of the SOI layer 105.

Gate dielectrics can include silicon oxide, silicon nitride, silicon oxynitride, boron nitride, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate dielectric material may further include dopants such as lanthanum and aluminum. In one embodiment of the invention, the conformal layer of gate dielectric material is formed with a thickness in a range of about 0.5 nm to about 2.5 nm, which will vary depending on the target application. In this case, the thickness of the gate dielectric layers 122 is a horizontal measurement on side portions of the spacers 114, hardmask 113, the stacked configuration of Si and SiGe layers 110a, b and 112a, b, and the 501 layer 105, and a vertical measurement on the exposed upper surface of a remaining portion of the SOI layer 105. The conformal layer of gate dielectric material is deposited using known methods such as, but not necessarily limited to, atomic layer deposition (ALD), which allows for high conformality of the gate dielectric material.

Gate conductors 120 include, but are not necessarily limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of such conductive materials. The layer of conductive material may further include dopants that are incorporated during or after deposition. The layer of conductive material is deposited using a suitable deposition process, for example, chemical vapor deposition (CVD), plasma-enhanced CVD (PECVD), physical vapor deposition (MID), plating, thermal or e-beam evaporation, sputtering, etc.

In some embodiments, a gate structure further includes a work function metal (WFM) between the gate dielectric and gate conductor. WFM may be deposited over the conformal layer of gate dielectric material prior to depositing the layer of gate conductive material. The thin conformal WFM layer can be formed of one or more types of metallic materials, including, but not limited to, TiN, TaN, TiAlC, Zr, W, Hf, Ti, Al, Ru, Pa, TiAl, ZrAl, WAl, TaAl, HfAl, TiAlC, TaC, TiC, TaMgC, or other work function metals or alloys that are commonly used to obtain target work functions which are suitable for the type (e.g., n-type or p-type) of FET devices that are to be formed. The conformal WFM layer is deposited using known methods such as atomic layer deposition (ALD), CVD, etc. In one embodiment, the conformal WFM layer is formed with a thickness in a range of about 2 nm to about 5 nm. The thickness of the conformal WFM layer is measured in the same manner as the thickness of the gate dielectric layer 122. In some embodiments, the conductive material that forms the gate conductor can serve as a WFM layer.

Figure 6:
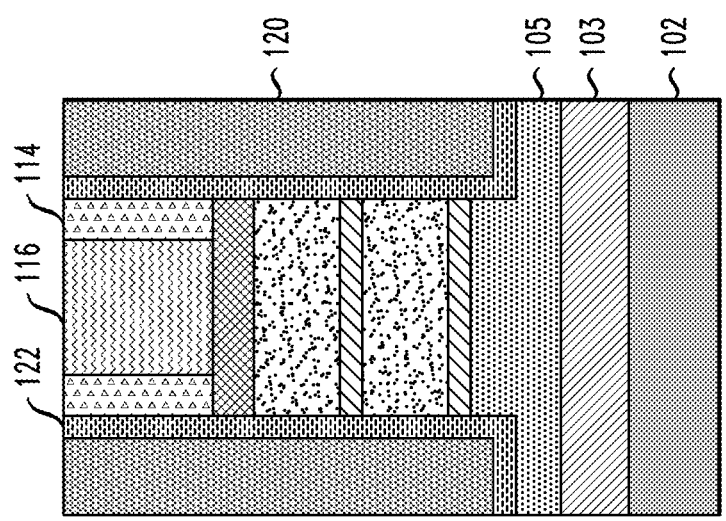
FIG. 6 is a cross-sectional view illustrating mandrel removal and removal of a center portion of the stacked configuration under the mandrel, in a method of manufacturing a semiconductor device, according to an exemplary embodiment of the invention.

FIG. 6 is a cross-sectional view illustrating mandrel removal and removal of a center portion of the stacked configuration under the mandrel, in a method of manufacturing a semiconductor device, according to an exemplary embodiment of the invention. Referring to FIG. 6, after formation of the gate structures, the mandrel 116 can be removed by, for example, an etching process, such as, for example, a RIE process. Other etch processes (isotropic or anisotropic) that etch the mandrel material selective to other materials can be used. For example, if the mandrel is amorphous carbon, it can be removed by a dry etch process such as a plasma etch using oxygen, or a combination of hydrogen and nitrogen. Amorphous carbon can also be removed by a wet etch process using sulfuric acid and hydrogen peroxide. Once the mandrel 116 is removed, central portions of the hardmask 113, the stacked configuration of Si and SiGe layers 110a, b and 112a, b, and the SOI layer 105 that were under the mandrel 116 are also removed by, for example, an etching process, such as, for example, an RIE process, where the spacers 114 act as masks, leaving an opening 130 between what will eventually become 2 SETs on left and right sides of the opening 130. The remaining portions of the layers under the spacers 114 can be relatively narrow, for example, similar to fin widths defined by a spacer image transfer (SIT) process. Optionally, after RIE, the lateral width of layers under the spacers 114 can be further reduced by laterally etching those layers. In accordance with an embodiment of the present invention, the resulting width of the layers under the spacers 114 can be about 2 nm to about 10 nm, for example, about 2 nm to about 5 nm. A width of the spacers 114 can be, for example, about 3 nm-about 15 nm.

Figure 7:
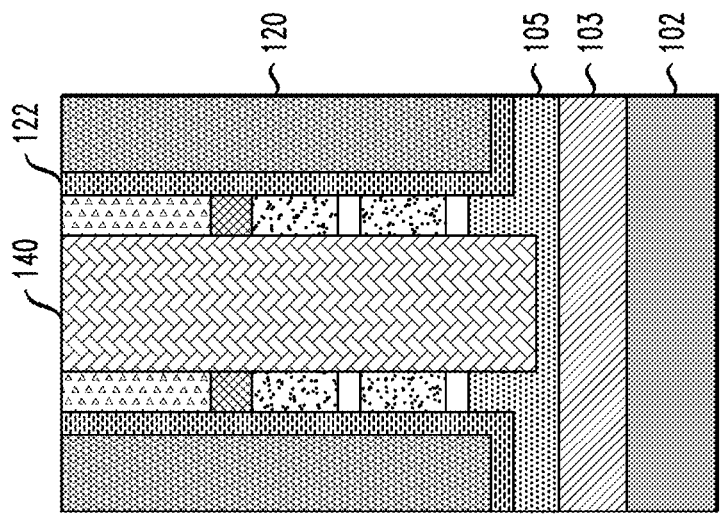
FIG. 7 is a cross-sectional view illustrating selective removal of silicon germanium (SiGe) layers to create gaps, in a method of manufacturing a semiconductor device, according to an exemplary embodiment of the invention.

FIG. 7 is a cross-sectional view illustrating selective removal of silicon germanium (SiGe) layers to create gaps, in a method of manufacturing a semiconductor device, according to an exemplary embodiment of the invention. Referring to FIG. 7, the remaining portions of the SiGe layers 110a and 110b are selectively undercut to form gaps 210a and 210b, formed adjacent the remaining portion of the SOI layer 105, and the patterned Si layers 212a and 212b. The patterned hardmask 213 is formed on the uppermost patterned Si layer 212b. The selective removal of the remaining portions of the SiGe layers 110a and 110b is performed by, for example, an etching process using hydrogen peroxide ($H_2O_2$), or other wet etching process, to create the gaps 210a and 210b. In accordance with an embodiment of the present invention, the gaps 210a and 210b comprise air, and are about 2 nm thick (in the vertical direction in FIG. 7) and about 5 nm wide (in the horizontal direction in FIG. 7). Alternatively, the gaps 210a and 210b can include a gas, such as hydrogen, nitrogen, oxygen, helium, argon, neon, or krypton. In another alternative, the gaps 210a and 210b can be a vacuum.

Figure 8:
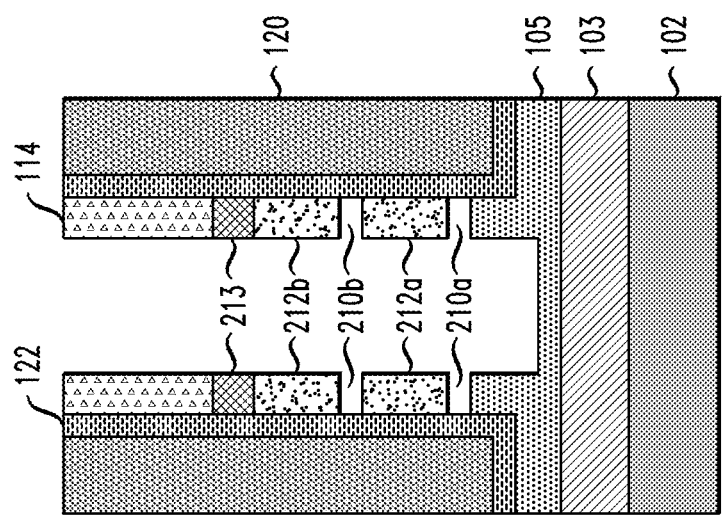
FIG. 8 is a cross-sectional view illustrating deposition of a dielectric layer, in a method of manufacturing a semiconductor device, according to an exemplary embodiment of the invention.

FIG. 8 is a cross-sectional view illustrating deposition of a dielectric layer, in a method of manufacturing a semiconductor device, according to an exemplary embodiment of the invention. Referring to FIG. 8, a dielectric layer 140, such as, for example, silicon dioxide ($SiO_2$), silicon nitride, silicon oxynitride, SiBCN, SiOCN, SiOC, Si:C (carbon doped silicon), N, etc. or any suitable combination of those materials, is deposited in the opening 130 to seal the gaps 210a and 210b and fill the opening 130. The dielectric layer 140 can be deposited using for example, a directional deposition technique such as, but not necessarily limited to, gas cluster ion beam (GCIB) or high-density plasma (HDP) deposition. According to an embodiment, after the dielectric deposition, at least a portion of the gaps remains, so that the gaps are not completely filled by the dielectric.

Figure 9:
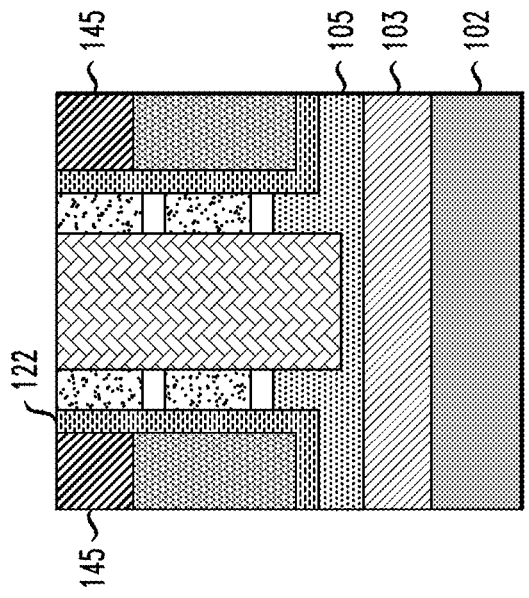
FIG. 9 is a cross-sectional view illustrating planarization, in a method of manufacturing a semiconductor device, according to an exemplary embodiment of the invention.

FIG. 9 is a cross-sectional view illustrating planarization, in a method of manufacturing a semiconductor device, according to an exemplary embodiment of the invention. Referring to FIG. 9, the structure of FIG. 8 is planarized down to the top of patterned Si layers 212b. The planarization process, which can include, for example, chemical mechanical polishing (CMP), removes a portion of the dielectric layer 140, the spacers 114, the patterned hardmask layers 213, portions of the gate conductors 120 and portions of the gate dielectrics 122 on sides of the dielectric layer 140.

Figure 10:
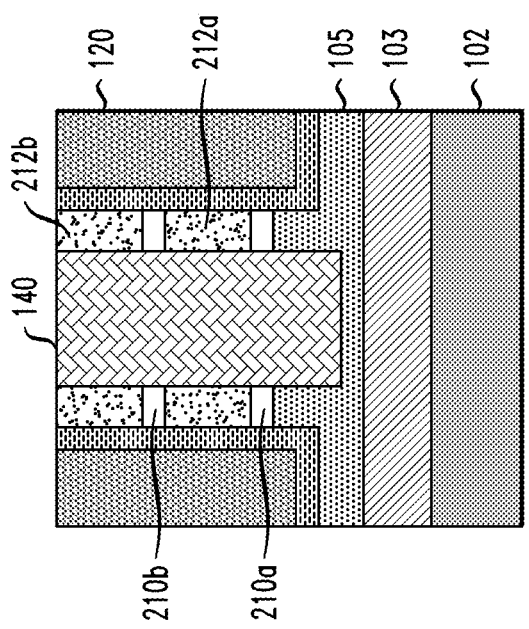
FIG. 10 is a cross-sectional view illustrating recessing of gate structures and formation of a cap layer, in a method of manufacturing a semiconductor device, according to an exemplary embodiment of the invention.

FIG. 10 is a cross-sectional view illustrating recessing of gate structures and formation of a cap layer, in a method of manufacturing a semiconductor device, according to an exemplary embodiment of the invention. Referring to FIG. 10, portions of the gate conductors 120 are removed using, for example, an anisotropic etch process, such as RIE, ion beam etching, plasma etching or laser ablation. As can be seen, the layers 120 are recessed to lower heights above the substrate 102. Then a dielectric layer, such as, for example a PECVD-type, high aspect ratio process (HARP)-type or HDP-type low-K dielectric layers, including, but not limited to, SiBCN, SiN or $SiO_2$ is deposited using, for example, PECVD, HARP or HDP techniques, on the recessed gate conductors 120 adjacent the gate dielectric layers 122, as well as on gate dielectric layers 122, silicon layers 212b, and dielectric layer 140. The deposited dielectric layer is then planarized to remove the deposited dielectric layer from on gate dielectric layers 122, silicon layers 212b, and dielectric layer 140 to result in cap layers 145 in the recessed portions of the gate conductors 120 as shown in FIG. 10. The cap layers 145 improve isolation between the gate conductors 120 and the uppermost Si layers 212b, which will be source/drain regions of the resulting SETs. The recessing of the gate conductors 120 reduces overlap between the gate conductors 120 and the uppermost Si layers 212b.

Figure 11:
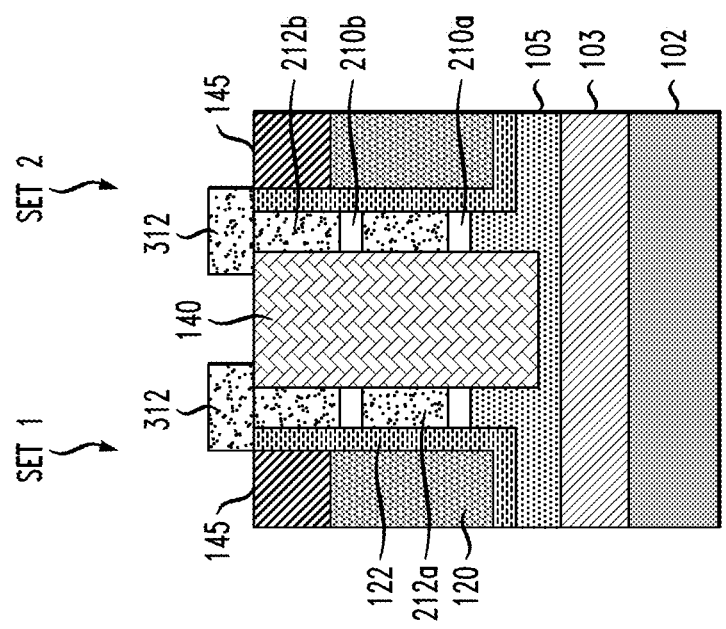
FIG. 11 is a cross-sectional view illustrating enlarging of a source/drain region, in a method of manufacturing a semiconductor device, according to an exemplary embodiment of the invention.

FIG. 11 is a cross-sectional view illustrating enlarging of a source/drain region, in a method of manufacturing a semiconductor device, according to an exemplary embodiment of the invention. As shown in FIG. 11, the source/drain regions 212b are enlarged by epitaxially growing additional source/drain regions 312 thereon. Application of the sources for n+ type transistor and p+ type transistor epitaxial growth can be done by using block level patterning. For an n+ type transistor, for example, arsenic (As), phosphorus (P), or antimony (Sb) doped Si, or Si:C (carbon-doped silicon), source/drain regions 312 are epitaxially grown. For a p+ type transistor, for example, boron (B), or indium (In) doped Si, source/drain regions 312 are epitaxially grown. Doping can be at concentrations in the general range of $1e19/cm^3$ to $2e21/cm^3$. Alternatively, the epitaxy can be undoped and additional dopants can be added by any suitable doping techniques, including but not limited to, ion implantation, gas phase doping, plasma doping, plasma immersion ion implantation, cluster doping, infusion doping, liquid phase doping, solid phase doping, etc. Dopant activation processes (e.g., by laser anneal, flash anneal, rapid thermal anneal) be performed when needed.

As can be seen in FIG. 11, two SETs, SET 1 and SET 2, each including a source/drain region 312/212b separated from island region 212a by gap 210b, and source/drain region 105 separated from island region 212a by gap 210a, are formed on left and right sides of dielectric layer 140. The SETs 1 and 2 further include gate structures including gate conductors 120, gate dielectrics 122 and cap layers 145. In accordance with an embodiment of the present invention, the island region comprises a semiconductor quantum dot with a dimension that is less than about 6 nm in any given direction.

Figure 12:
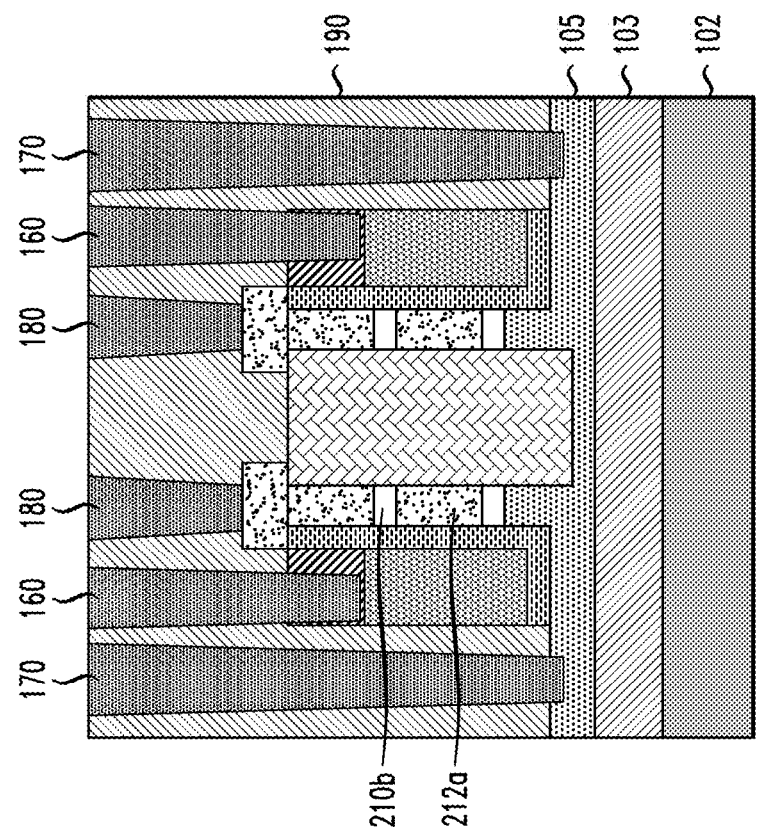
FIG. 12 is a cross-sectional view illustrating deposition of an interlevel dielectric (ILD) and formation of contact regions, in a method of manufacturing a semiconductor device, according to an exemplary embodiment of the invention.

FIG. 12 is a cross-sectional view illustrating deposition of an interlevel dielectric (ILD) and formation of contact regions, in a method of manufacturing a semiconductor device, according to an exemplary embodiment of the invention. Referring to FIG. 12, which is a wider view of the resulting device than that shown in FIGS. 1-11, a dielectric material, including, but not limited to silicon oxide, silicon nitride, silicon oxynitride, SiCO, SiBCN, SiOCN, fluorine doped oxide, or some other dielectric, or any suitable combination of those materials, is deposited on the resulting structure from FIG. 11, including left and right extended portions of the SOI layer 105 illustrated in FIG. 12 to form interlevel dielectric (ILD) layer 190. The left and right extended portions of the SOI layer 105 illustrated in FIG. 12 are not shown in the narrower views of the device in FIGS. 1-11. The ILD layer 190 can be deposited using deposition techniques including, but not limited to, CVD, PECVD, radio-frequency CVD (RFCVD), PVD, ALD, molecular layer deposition (MLD), molecular beam deposition (MBD), pulsed laser deposition (PLD), and/or liquid source misted chemical deposition (LSMCD), sputtering, and/or spin-on. Planarization, for example, CMP can be performed to remove excess material from ILD layer 190 and planarize the resulting structure.

Referring to FIG. 12, contact regions 160, 170 and 180 to gate structures, source and drain regions are formed by etching vias in the ILD layer 190 and through cap layers 145, and filling the vias with an electrically conductive material. For example, contact regions 160, 170 and 180 can include a conductive metal such as, but not necessarily limited to, tungsten, cobalt, ruthenium, copper, or combinations thereof. The contacts may further comprise a conductive liner on the sidewalk of contact trenches. The conductive liner can include, but is not necessarily limited to, tantalum nitride, titanium nitride, ruthenium, or ruthenium oxide. The conductive metal may be deposited using, for example, deposition techniques including, but not limited to, CVD, PECVD, RFCVD, PVD, ALD, MLD, MBD, pulsed laser deposition, and/or LSMCD, sputtering, and/or plating. Planarization, for example, CMP can be performed to remove excess contact material after deposition and planarize the resulting structure.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
   a vertical single electron transistor (SET) comprising:
   an island region over a top surface of a substrate;
   a bottom source/drain region on the top surface of the substrate and under the island region, and a top source/drain region over the top surface of the substrate and over the island region;
   wherein the top source/drain region is at a different height in a direction perpendicular to the top surface of the substrate than a height of the bottom source/drain region;
   a first gap between the bottom source/drain region and the island region;
   a second gap between the top source/drain region and the island region; and
   a gate structure on a side of the island region;
   wherein the first and second gaps are selected from the group consisting of air, a vacuum, nitrogen, hydrogen, oxygen, carbon dioxide, helium, argon, neon, and krypton.

2. The semiconductor device according to claim 1, wherein the first and second gaps are about 0.5 nm-about 3 nm thick.

3. The semiconductor device according to claim 1, wherein the island region is about 3 nm-about 5 nm thick.

4. The semiconductor device according to claim 1, wherein the first and second gaps are tunnel barriers of the vertical SET.

5. The semiconductor device according to claim 1, wherein the island region comprises a dimension that is less than about 6 nm in any given direction.

6. The semiconductor device according to claim 1, further comprising an additional vertical SET spaced apart from the vertical SET.

7. The semiconductor device according to claim 6, further comprising a dielectric layer between the vertical SET and the additional vertical SET.

8. The semiconductor device according to claim 6, wherein the additional vertical SET comprises:
   an additional island region across from the island region;
   an additional bottom source/drain region under the additional island region, and an additional top source/drain region over the additional island region;
   a third gap between the additional bottom source/drain region and the additional island region, and across from the first gap;
   a fourth gap between the additional top source/drain region and the additional island region, and across from the second gap; and
   an additional gate structure on a side of the additional island region.

9. The semiconductor device according to claim 8, wherein the third and fourth gaps are tunnel barriers of the additional vertical SET.

10. A semiconductor device, comprising:
    a vertical single electron transistor (SET) comprising:
    an island region over a top surface of a substrate;
    a bottom source/drain region on the top surface of the substrate and under the island region, and a top source/drain region over the top surface of the substrate and over the island region;
    wherein the top source/drain region is at a different height in a direction perpendicular to the top surface of the substrate than a height of the bottom source/drain region;
    a first gap between the bottom source/drain region and the island region;
    a second gap between the top source/drain region and the island region;
    a gate structure on a side of the island region; and
    an additional vertical SET spaced apart from the vertical SET;
    wherein the additional vertical SET comprises:
    an additional island region across from the island region;
    an additional bottom source/drain region under the additional island region, and an additional top source/drain region over the additional island region;
    a third gap between the additional bottom source/drain region and the additional island region, and across from the first gap;
    a fourth gap between the additional top source/drain region and the additional island region, and across from the second gap; and
    an additional gate structure on a side of the additional island region;
    wherein the third and fourth gaps are selected from the group consisting of air, a vacuum, nitrogen, hydrogen, oxygen, carbon dioxide, helium, argon, neon, and krypton.

11. A semiconductor device, comprising:
    a first vertical single electron transistor (SET) spaced apart from a vertical second SET; and
    a dielectric layer between the first and second vertical SETs, wherein the first and second vertical SETs each comprise:
    an island region over a top surface of a substrate;
    a bottom source/drain region on the top surface of the substrate and under the island region, and a top source/drain region over the top surface of the substrate and over the island region;
    wherein the top source/drain region is at a different height in a direction perpendicular to the top surface of the substrate than a height of the bottom source/drain region;
    a first gap between the bottom source/drain region and the island region;
    a second gap between the top source/drain region and the island region; and
    a gate structure on a side of the island region;
    wherein the first and second gaps of the first and second vertical SETs are each selected from the group consisting of air, a vacuum, nitrogen, hydrogen, oxygen, carbon dioxide, helium, argon, neon, and krypton.

12. The semiconductor device according to claim 11, wherein the first and second gaps of the first and second vertical SETs are each about 0.5 nm-about 3 nm thick.

13. The semiconductor device according to claim 11, wherein the island regions of the first and second vertical SETs are each about 3 nm-about 5 nm thick.

14. The semiconductor device according to claim 11, wherein the first and second gaps of the first and second vertical SETs are each a tunnel barrier for their corresponding vertical SET.

15. The semiconductor device according to claim 11, wherein the island regions of the first and second vertical SETs each comprise a dimension that is less than about 6 nm in any given direction.

* * * * *